United States Patent
Tsubata et al.

(10) Patent No.: US 10,461,245 B2
(45) Date of Patent: Oct. 29, 2019

(54) MAGNETIC MEMORY DEVICE AND METHOD OF MANUFACTURING THE SAME

(71) Applicant: TOSHIBA MEMORY CORPORATION, Minato-ku, Tokyo (JP)

(72) Inventors: Shuichi Tsubata, Seoul (KR); Masatoshi Yoshikawa, Seoul (KR); Satoshi Seto, Seoul (KR); Kazuhiro Tomioka, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 64 days.

(21) Appl. No.: 14/637,019

(22) Filed: Mar. 3, 2015

(65) Prior Publication Data

US 2016/0072056 A1 Mar. 10, 2016

Related U.S. Application Data

(60) Provisional application No. 62/046,025, filed on Sep. 4, 2014.

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/222* (2013.01); *H01L 43/02* (2013.01)

(58) Field of Classification Search
None
See application file for complete search history.

(56) References Cited

U.S. PATENT DOCUMENTS

| 8,716,818 | B2 | 5/2014 | Yoshikawa et al. | |
|---|---|---|---|---|
| 2006/0054947 | A1* | 3/2006 | Asao | H01L 43/08 257/295 |
| 2007/0241410 | A1* | 10/2007 | Umehara | B82Y 10/00 257/379 |
| 2009/0039451 | A1* | 2/2009 | Ueno | H01L 27/228 257/421 |
| 2009/0086383 | A1* | 4/2009 | Hara | B82Y 25/00 360/324 |

(Continued)

FOREIGN PATENT DOCUMENTS

| JP | 05182937 A | 7/1993 |
|---|---|---|
| JP | 10209118 A | 8/1998 |

OTHER PUBLICATIONS

U.S. Appl. No. 14/629,087, filed Feb. 23, 2015, First Named Inventor: Satoshi Seto, Title: "Semiconductor Memory Device and Manufacturing Method Thereof".

*Primary Examiner* — Davienne N Monbleau
*Assistant Examiner* — Scott R Wilson
(74) *Attorney, Agent, or Firm* — Holtz, Holtz & Volek PC

(57) ABSTRACT

According to one embodiment, a method of manufacturing a magnetic memory device, includes forming a stack film including a magnetic layer on an underlying area, forming a hard mask on the stack film, forming a stack structure by etching the stack film using the hard mask as a mask, forming a first protective insulating film on a side surface of the stack structure, and performing an oxidation treatment.

12 Claims, 5 Drawing Sheets

(56) References Cited

U.S. PATENT DOCUMENTS

| | | | |
|---|---|---|---|
| 2011/0156182 A1* | 6/2011 | Takeuchi | B82Y 10/00 |
| | | | 257/421 |
| 2012/0018792 A1* | 1/2012 | Matsushita | G11C 16/0466 |
| | | | 257/316 |
| 2014/0284734 A1* | 9/2014 | Kanaya | H01L 43/02 |
| | | | 257/421 |
| 2015/0061052 A1* | 3/2015 | Huang | H01L 43/08 |
| | | | 257/421 |
| 2015/0311251 A1* | 10/2015 | Yi | H01L 27/222 |
| | | | 257/421 |
| 2016/0027999 A1* | 1/2016 | Pinarbasi | H01L 43/02 |
| | | | 438/3 |

* cited by examiner

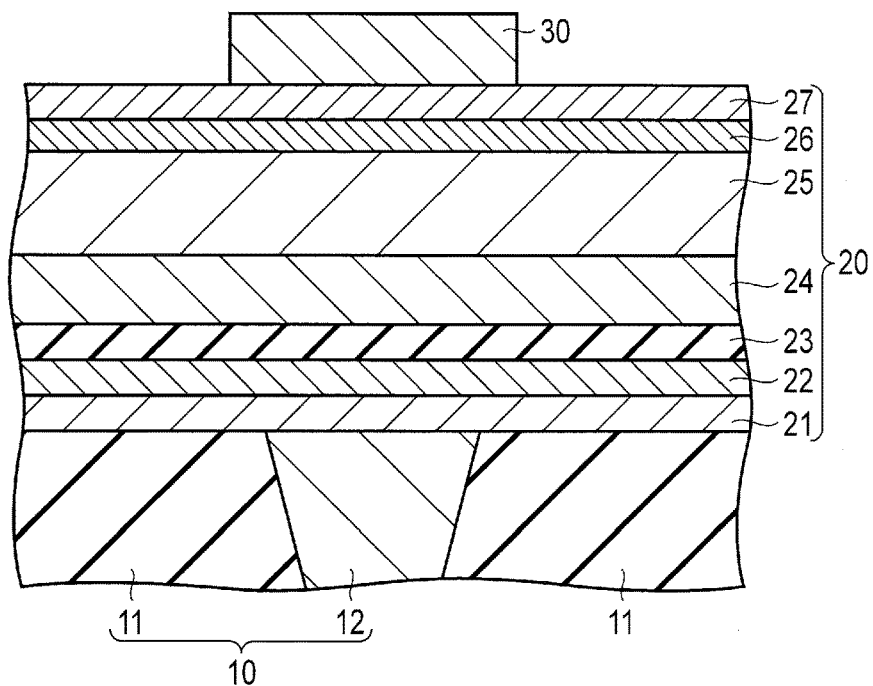
F I G. 1
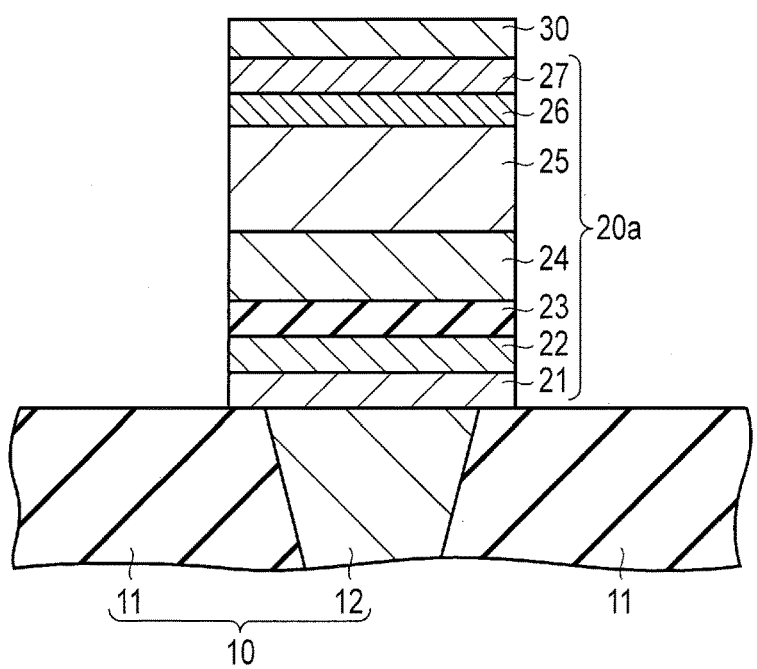
F I G. 2

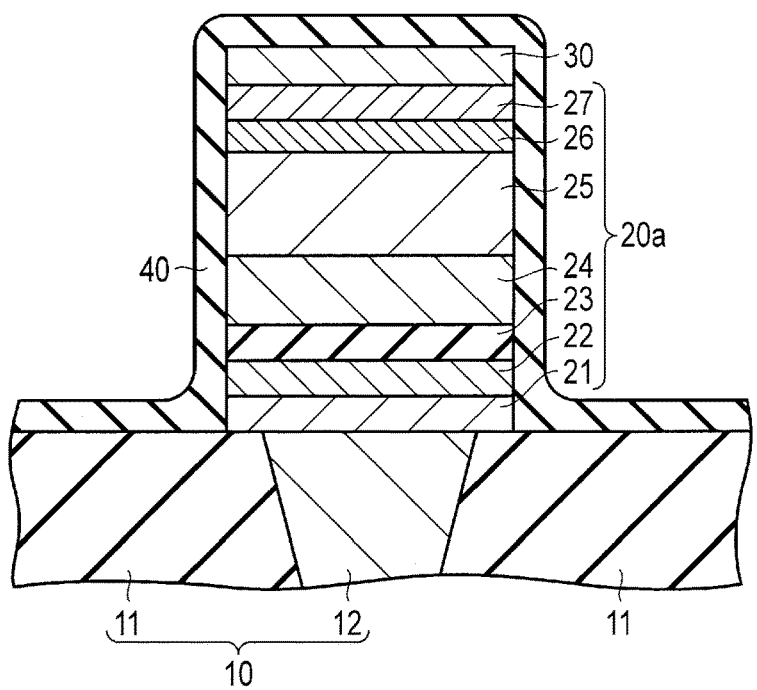
F I G. 3
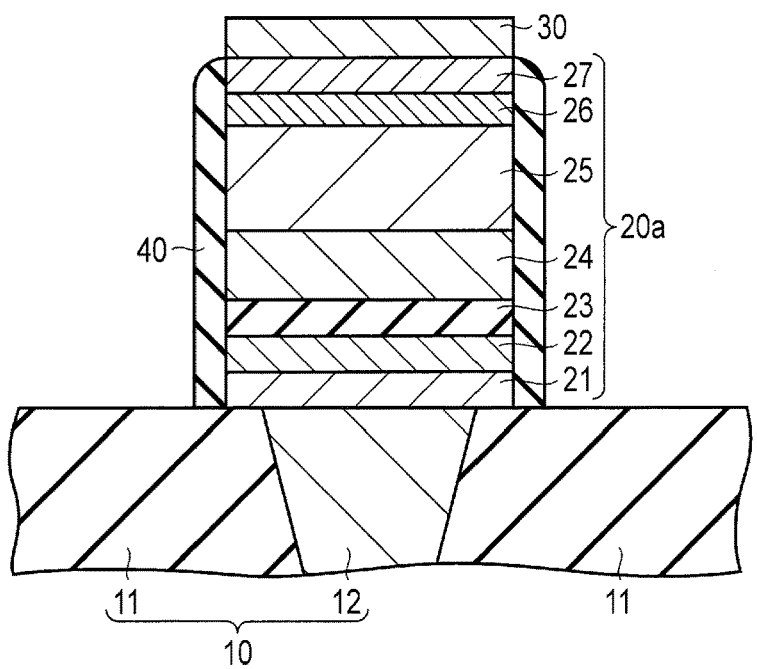
F I G. 4

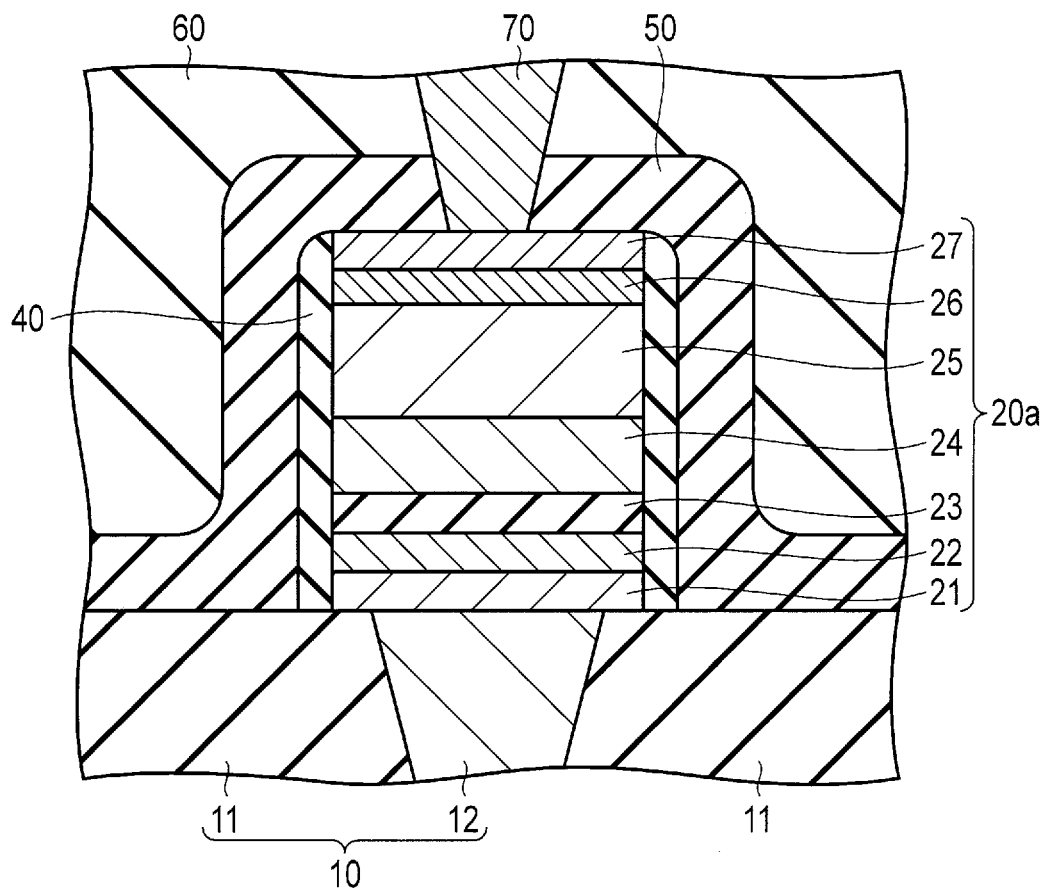
F I G. 7

MAGNETIC MEMORY DEVICE AND METHOD OF MANUFACTURING THE SAME

CROSS-REFERENCE TO RELATED APPLICATIONS

This application claims the benefit of U.S. Provisional Application No. 62/046,025, filed Sep. 4, 2014, the entire contents of which are incorporated herein by reference.

FIELD

Embodiments described herein relate generally to a magnetic memory device and a method of manufacturing the same.

BACKGROUND

A magnetic memory device (a semiconductor integrated circuit device) in which a magnetoresistive effect element is formed on a semiconductor substrate has been proposed.

The magnetoresistive effect element mentioned above has a stack structure formed of a plurality of layers including magnetic layers. The stack structure is formed by etching a stack film by using a hard mask as a mask. The hard mask is usually removed by oxidizing the hard mask. Accordingly, the performance of the magnetoresistive effect element may be adversely affected when a side surface of the stack structure is excessively oxidized in removing the hard mask.

Also, an interlayer insulating film is formed around the stack structure. Usually, the interlayer insulating film is formed in an oxidizing atmosphere. Accordingly, the side surface of the stack structure may be excessively oxidized in forming the interlayer insulating film, and the performance of the magnetoresistive effect element may be adversely affected.

Accordingly, a magnetic memory device capable of preventing the side surface of the stack structure from being excessively oxidized, and a method of manufacturing the magnetic memory device are desired.

BRIEF DESCRIPTION OF THE DRAWINGS

FIG. 1 is a cross-sectional view which schematically shows a part of a method of manufacturing a magnetic memory device according to an embodiment;

FIG. 2 is a cross-sectional view which schematically shows a part of the method of manufacturing the magnetic memory device according to the embodiment;

FIG. 3 is a cross-sectional view which schematically shows a part of the method of manufacturing the magnetic memory device according to the embodiment;

FIG. 4 is a cross-sectional view which schematically shows a part of the method of manufacturing the magnetic memory device according to the embodiment;

FIG. 7 is a cross-sectional view which schematically shows a part of the method of manufacturing the magnetic memory device according to the embodiment.

DETAILED DESCRIPTION

Figure 5:
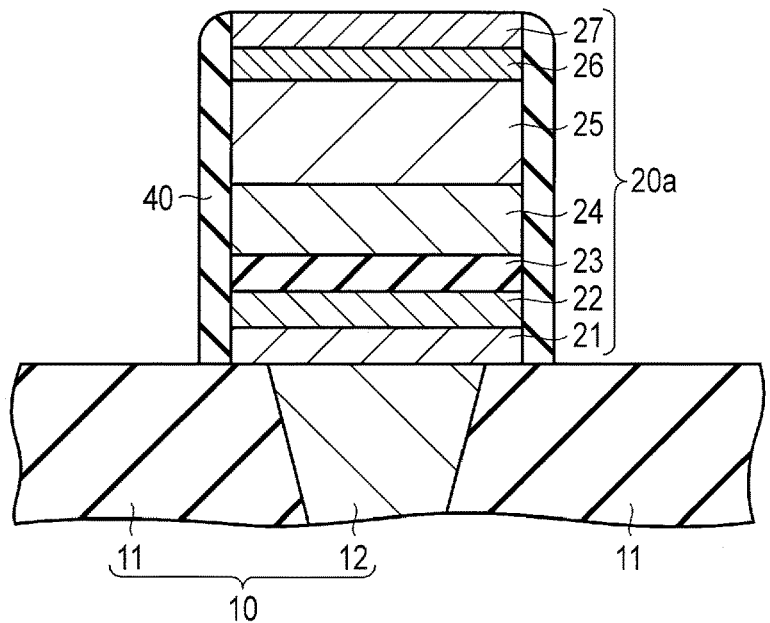
FIG. 5 is a cross-sectional view which schematically shows a part of the method of manufacturing the magnetic memory device according to the embodiment.

In general, according to one embodiment, a method of manufacturing a magnetic memory device, includes: forming a stack film including a magnetic layer on an underlying area; forming a hard mask on the stack film; forming a stack structure by etching the stack film using the hard mask as a mask; forming a first protective insulating film on a side surface of the stack structure; and performing an oxidation treatment.

The embodiment will be described hereinafter with reference to the accompanying drawings.

FIGS. 1 to 7 are cross-sectional views which schematically show a method of manufacturing a magnetic memory device (a semiconductor integrated circuit device) according to the embodiment.

First of all, as shown in FIG. 1, an underlying area 10 is formed on a semiconductor substrate which is not shown. The underlying area 10 includes an interlayer insulating film 11, and a bottom electrode 12 provided within the interlayer insulating film 11. On a surface area of the semiconductor substrate, a transistor (not shown), such as a select transistor for selecting a magnetoresistive effect element, is formed. Note that in the descriptions provided below, the magnetoresistive effect element may be referred to as a magnetic tunnel junction (MTJ) element.

Next, a stack film 20 is formed on the underlying area 10. The stack film 20 comprises an under layer 21, a storage layer (a first magnetic layer) 22 provided over the under layer 21, a tunnel barrier layer (a nonmagnetic layer) 23 provided over the storage layer 22, a reference layer (a second magnetic layer) 24 provided over the tunnel barrier layer, a shift cancelling layer 25 provided over the reference layer, a cap layer 26 provided over the shift cancelling layer 25, and a seed layer 27 provided over the cap layer 26.

The storage layer 22 has variable magnetization, and is formed of a CoFeB layer, for example. The tunnel barrier layer 23 is formed of an MgO layer, for example. The reference layer 24 has fixed magnetization, and is formed of a CoFeB layer, for example. The storage layer 22 and the reference layer 24 may further include a CoPt layer. The shift cancelling layer 25 is provided to cancel a magnetic field applied from the reference layer 24 on the storage layer 22, and is formed of a layer containing Co, for example.

Next, a pattern of a hard mask 30 is formed on the stack film 20. The hard mask 30 is formed of carbon. Specifically, the hard mask 30 is formed of amorphous carbon. More specifically, the hard mask 30 is formed of diamond-like carbon (DLC). A carbon film of the hard mask 30 may contain hydrogen (of the order of 50 atom % or less).

A method of forming the hard mask 30 will be described below. Firstly, a hard mask film is formed on the stack film 20. Specifically, the hard mask film is formed by plasma chemical vapor deposition (CVD) using hydrocarbon gas (for example, acetylene gas). After that, the hard mask film is patterned by lithography and reactive ion etching (RIP), thereby forming the pattern of the hard mask 30.

Next, as shown in FIG. 2, by etching the stack film 20 by using the hard mask 30 as a mask, a stack structure 20a is formed. Specifically, the stack film 20 is etched by ion beam etching (IBE).

Next, as shown in FIG. 3, a first protective insulating film 40 is formed on the entire surface. In this way, the underlying area 10 and the stack structure 20a are covered by the protective insulating film 40. Also, after etching, it is preferable that the first protective insulating film 40 be formed without exposing it to the atmosphere. For the protective insulating film 40, a silicon nitride film formed by plasma CVD is used. Other than the above, for example, an AlO film, an MgO film, an SiO film, a BN film, or an SiCN film may be used.

Next, as shown in FIG. 4, the protective insulating film 40 is etched by anisotropic etching. In this way, a structure in which the protective insulating film 40 is formed on only a side surface of the stack structure 20a is obtained.

Next, as shown in FIG. 5, in a state where the side surface of the stack structure 20a is protected by the protective insulating film 40, the hard mask 30 is oxidized, thereby removing the hard mask 30. Specifically, by oxidizing the hard mask 30 by using oxygen plasma, the hard mask 30 is removed. At this time, since the protective insulating film 40 is formed on the side surface of the stack structure 20a, the side surface of the stack structure 20a is prevented from being oxidized.

Figure 6:
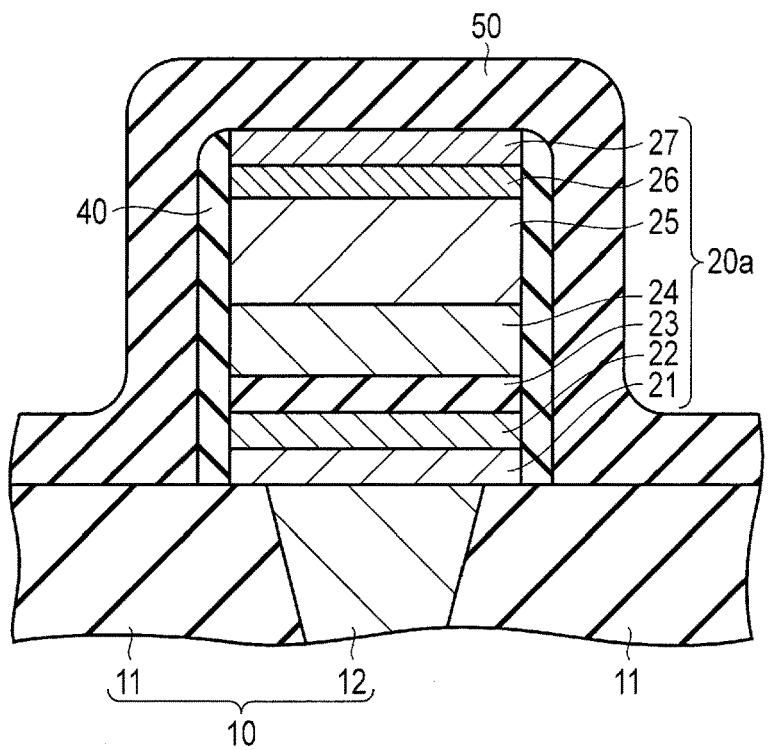
FIG. 6 is a cross-sectional view which schematically shows a part of the method of manufacturing the magnetic memory device according to the embodiment.

Next, as shown in FIG. 6, a second protective insulating film 50 is formed on the entire surface. In this way, the underlying area 10, the stack structure 20a, and the protective insulating film 40 are covered by the protective insulating film 50. For the protective insulating film 50, a silicon nitride film formed by plasma CVD is used.

Next, as shown in FIG. 7, an interlayer insulating film 60 which covers the protective insulating film 50 is formed. Specifically, as the interlayer insulating film 60, a silicon oxide film is formed in an oxidizing atmosphere. Further, a hole is made in the protective insulating film 50 and the interlayer insulating film 60, and a top electrode 70 is formed in this hole.

As described above, a magnetic memory device as shown in FIG. 7 is formed. That is, the magnetic memory device comprising a magnetoresistive effect element (MTJ element) which includes the storage layer (first magnetic layer) 22 having variable magnetization, the reference layer (second magnetic layer) 24 having fixed magnetization, the tunnel barrier layer (nonmagnetic layer) 23 formed between the storage layer 22 and the reference layer 24, and the shift cancelling layer 25 formed over the reference layer 24 is obtained.

The aforementioned MTJ element is a magnetic element having perpendicular magnetization, for example. That is, the direction of magnetization of the storage layer 22, the reference layer 24, and the shift cancelling layer 25 is a direction perpendicular to the surface of each of these layers. When the directions of magnetization of the storage layer 22 and the reference layer 24 are parallel, the MTJ element is in a low-resistance state. When the directions of magnetization of the storage layer 22 and the reference layer 24 are antiparallel, the MTJ element is in a high-resistance state. Binary information (0 or 1) can be stored in accordance with whether the MTJ element is in the low-resistance state or the high-resistance state. Also, the binary information (0 or 1) can be written in accordance with the direction of the current flowing through the MTJ element. Further, the direction of magnetization of the storage layer 22, the reference layer 24, and the shift cancelling layer 25 may be a direction parallel to the surface of each of these layers. In this case, the MTJ element becomes a magnetic element having magnetization in an in-plane direction.

As described above, in the present embodiment, in removing the hard mask 30 by an oxidation treatment, the side surface of the stack structure 20a is provided with the protective insulating film 40. The protective insulating film 40 prevents the side surface of the stack structure 20a from being oxidized. Supposing that the protective insulating film 40 is not provided, the side surface of the stack structure 20a will be excessively oxidized by the oxidation treatment, and the performance of the magnetoresistive effect element may be adversely affected. In the present embodiment, since oxidation of the side surface of the stack structure 20a is prevented, a magnetoresistive effect element having excellent performance can be obtained.

Further, in the present embodiment, the stack structure 20a is covered by a protective insulating film, and the protective insulating film is constituted of the first protective insulating film 40 formed along the side surface of the stack structure 20a, and the second protective insulating film 50 which covers the stack structure 20a and the first protective insulating film 40. That is, on the side surface of the stack structure 20a, the protective insulating film 40 is formed, but on an upper surface of the stack structure 20a, the protective insulating film 40 is not formed. Accordingly, the thickness of a portion of the protective insulating film formed on the side surface of the stack structure 20a (i.e., the thickness in a direction perpendicular to the side surface) is greater than the thickness of a portion of the protective insulating film formed on the upper surface of the stack structure 20a (i.e., the thickness in a direction perpendicular to the upper surface). As can be seen, since a thick protective insulating film (the protective insulating film 40 and the protective insulating film 50) is formed on the side surface of the stack structure 20a, the side surface of the stack structure 20a is prevented from being oxidized. For example, in forming the interlayer insulating film 60 in the oxidizing atmosphere in the step of FIG. 7, it is possible to prevent the side surface of the stack structure 20a from being oxidized. Accordingly, in the present embodiment, also from the above standpoint, a magnetoresistive effect element having excellent performance can be obtained.

Note that in the above-mentioned embodiment, by the oxidation treatment of FIG. 5, oxygen may be attached to a surface of the underlying area 10 and a surface of the protective insulating film 40. In such a case, oxygen exists at the boundary between the protective insulating film 40 and the protective insulating film 50, and the boundary between the underlying area 10 and the protective insulating film 50. Therefore, portions having oxygen concentrations higher than the surroundings correspond to the boundary between the protective insulating film 40 and the protective insulating film 50, and the boundary between the underlying area 10 and the protective insulating film 50.

Further, in the above-mentioned embodiment, constitution of the stack structure 20a is not particularly limited. As long as the stack structure 20a includes a magnetic layer, the basic structure and the basic manufacturing method of the embodiment described above can be applied.

Figure 8:
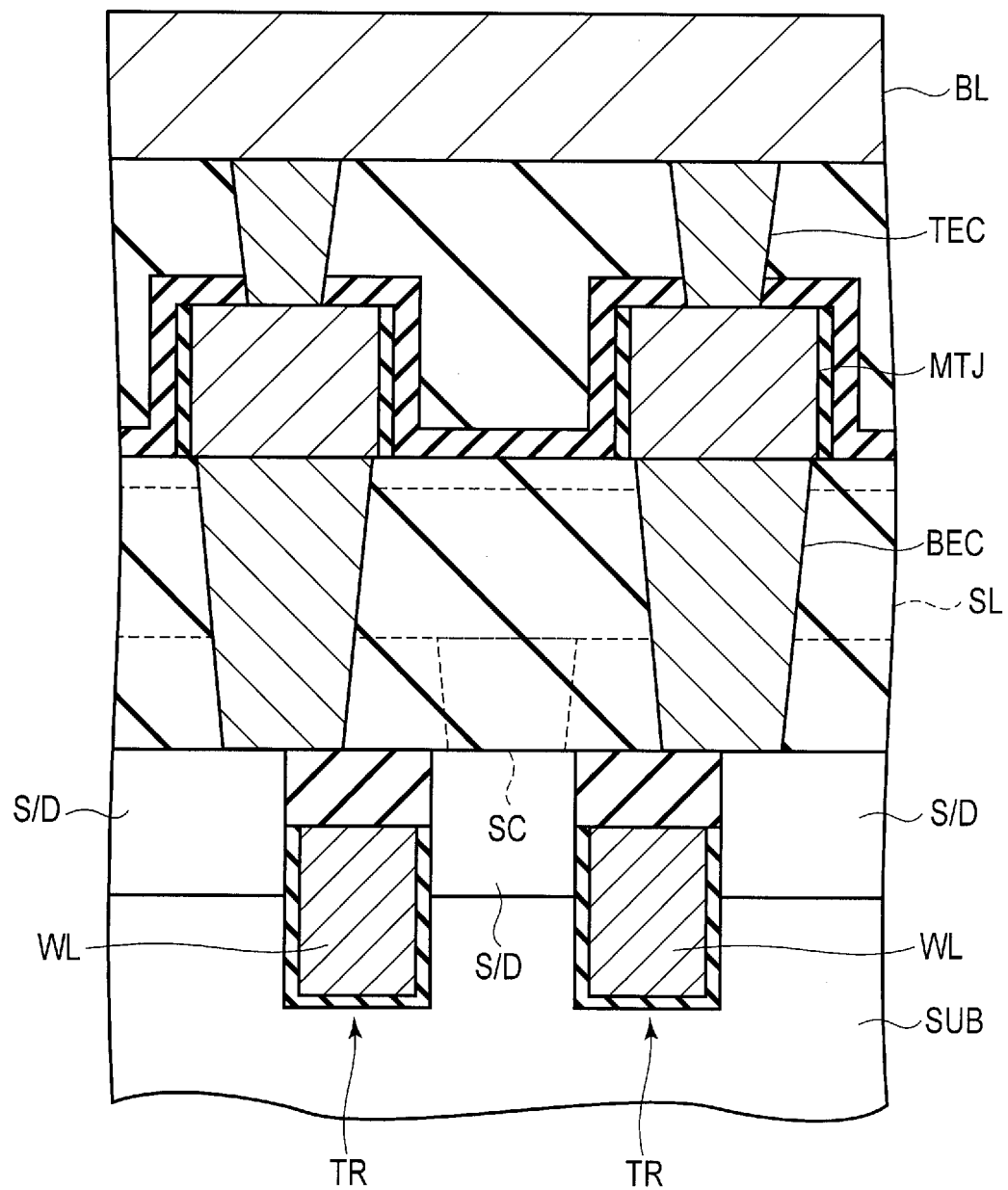
FIG. 8 is a view schematically showing a general structure of a semiconductor integrated circuit device in which a magnetoresistive effect element is employed.

FIG. 8 is a view schematically showing a general structure of a semiconductor integrated circuit device in which a magnetoresistive effect element (MTJ element) is employed.

A buried gate type MOS transistor TR is formed in a semiconductor substrate SUB. A gate electrode of the MOS transistor TR is used as a word line WL. A bottom electrode BEC is connected to one of source/drain regions S/D of the MOS transistor TR, and a source line contact SC is connected to the other of the source/drain regions S/D.

A magnetoresistive effect element MTJ is formed on the bottom electrode BEC, and a top electrode TEC is formed on the magnetoresistive effect element MTJ. A bit line BL is connected to the top electrode TEC. A source line SL is connected to the source line contact SC.

An excellent semiconductor integrated circuit device can be obtained by applying the structure and the method described in the above embodiment to the semiconductor integrated circuit device shown in FIG. 8.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
 a stack structure which is formed on an underlying area and includes a first magnetic layer having a variable magnetization direction, a second magnetic layer having a fixed magnetization direction, and a nonmagnetic layer provided between the first magnetic layer and the second magnetic layer;
 a protective insulating film covering the stack structure and provided along upper and side surfaces of the stack structure; and
 an interlayer insulating film covering upper and side surfaces of the protective insulating film,
 wherein:
 a portion of the protective insulating film formed on the side surface of the stack structure is thicker than a portion of the protective insulating film formed on the upper surface of the stack structure,
 the protective insulating film includes a first protective insulating film formed along the side surface of the stack structure, and a second protective insulating film covering the stack structure and the first protective insulating film,
 a side surface of the first magnetic layer, a side surface of the nonmagnetic layer, and a side surface of the second magnetic layer are provided continuously without a step,
 the first protective insulating film covers the side surfaces of the first magnetic layer, the nonmagnetic layer, and the second magnetic layer, and
 an oxygen concentration at a boundary between the first protective insulating film and the second protective insulating film is higher than that within the first protective insulating film and that within the second protective insulating film.

2. The device of claim 1, wherein the first protective insulating film is formed of a silicon nitride film.

3. The device of claim 1, wherein the second protective insulating film is formed of a silicon nitride film.

4. The device of claim 1, wherein the first protective insulating film is formed of a silicon nitride film and the second protective insulating film is formed of a silicon nitride film.

5. The device of claim 1, wherein the protective insulating film is formed along an upper surface of the underlying area.

6. The device of claim 1, wherein a lower surface of the protective insulating film and an upper surface of the underlying area exist in a same plane.

7. A magnetic memory device comprising:
 a stack structure which is formed on an underlying area and includes a first magnetic layer having a variable magnetization direction, a second magnetic layer having a fixed magnetization direction, and a nonmagnetic layer provided between the first magnetic layer and the second magnetic layer;
 a protective insulating film covering the stack structure and provided along upper and side surfaces of the stack structure; and
 an interlayer insulating film covering upper and side surfaces of the protective insulating film,
 wherein:
 a portion of the protective insulating film formed on the side surface of the stack structure is thicker than a portion of the protective insulating film formed on the upper surface of the stack structure,
 the protective insulating film includes a first protective insulating film formed along the side surface of the stack structure, and a second protective insulating film covering the stack structure and the first protective insulating film,
 a side surface of the first magnetic layer, a side surface of the nonmagnetic layer, and a side surface of the second magnetic layer are provided continuously without a step,
 the first protective insulating film covers the side surfaces of the first magnetic layer, the nonmagnetic layer, and the second magnetic layer, and
 an oxygen concentration at a boundary between the underlying area and the second protective insulating film is higher than that within the underlying area and that within the second protective insulating film.

8. The device of claim 7, wherein the first protective insulating film is formed of a silicon nitride film.

9. The device of claim 7, wherein the second protective insulating film is formed of a silicon nitride film.

10. The device of claim 7, wherein the first protective insulating film is formed of a silicon nitride film and the second protective insulating film is formed of a silicon nitride film.

11. The device of claim 7, wherein the protective insulating film is formed along an upper surface of the underlying area.

12. The device of claim 7, wherein a lower surface of the protective insulating film and an upper surface of the underlying area exist in a same plane.

* * * * *